(12) United States Patent
Knobloch et al.

(10) Patent No.: US 9,362,498 B2
(45) Date of Patent: Jun. 7, 2016

(54) METHOD OF FORMING A MEMORY AND METHOD OF FORMING A MEMORY ARRAY

(71) Applicant: Infineon Technologies AG, Neubiberg (DE)

(72) Inventors: Klaus Knobloch, Dresden (DE); Robert Strenz, Radebeul (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/837,029

(22) Filed: Aug. 27, 2015

(65) Prior Publication Data

US 2015/0372230 A1    Dec. 24, 2015

Related U.S. Application Data

(62) Division of application No. 14/194,897, filed on Mar. 3, 2014, now Pat. No. 9,147,840.

(51) Int. Cl.
    *H01L 21/20*    (2006.01)
    *H01L 45/00*    (2006.01)
    *H01L 27/24*    (2006.01)

(52) U.S. Cl.
    CPC ........ *H01L 45/1608* (2013.01); *H01L 27/2436* (2013.01); *H01L 27/2445* (2013.01); *H01L 27/2463* (2013.01); *H01L 45/04* (2013.01); *H01L 45/1233* (2013.01); *H01L 45/146* (2013.01); *H01L 45/16* (2013.01); *H01L 45/1675* (2013.01)

(58) Field of Classification Search
    CPC .................................................. H01L 45/1608
    USPC .......................................................... 438/382
    See application file for complete search history.

*Primary Examiner* — Anthony Ho

(57) ABSTRACT

A method of forming a memory includes forming a first electrode and a second electrode within a first layer over a semiconductor substrate, forming a resistive-switching memory element and an antifuse element over the first layer, wherein the resistive-switching memory element includes a metal oxide layer and is electrically contacting the first electrode, wherein the metal oxide layer has a first thickness and a forming voltage that corresponds to the first thickness, wherein the antifuse element includes a dielectric layer and is electrically contacting the second electrode, and wherein the dielectric layer has a second thickness that is less than the first thickness and a dielectric breakdown voltage that is less than the forming voltage, and forming a third electrode and a fourth electrode within a second layer over the resistive-switching memory element and the antifuse element, wherein the third electrode is electrically contacting the resistive-switching memory element and the fourth electrode is electrically contacting the antifuse element.

17 Claims, 10 Drawing Sheets

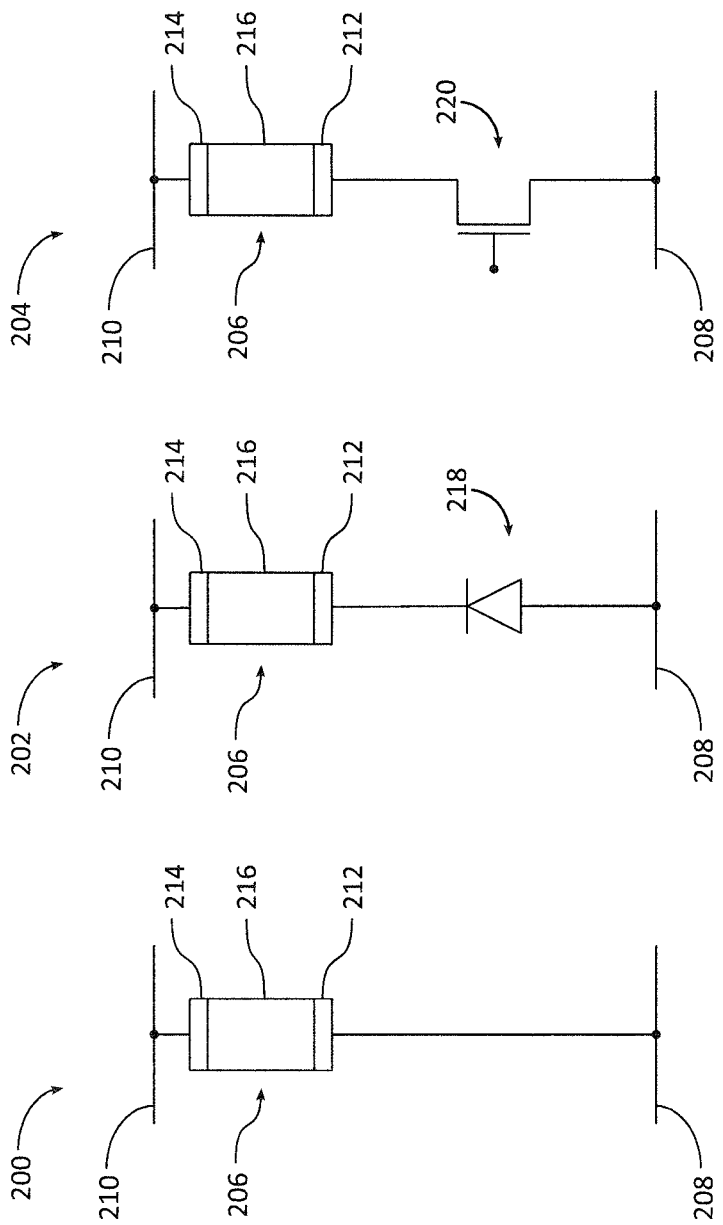

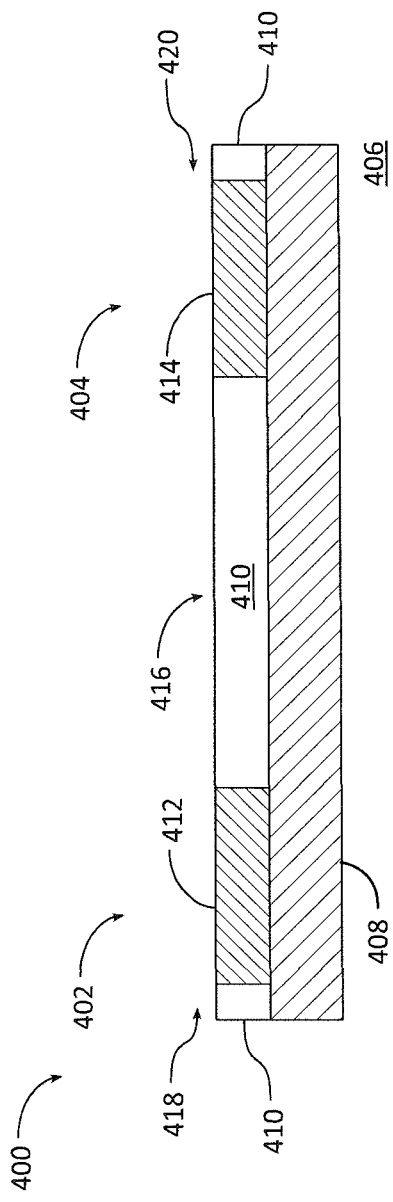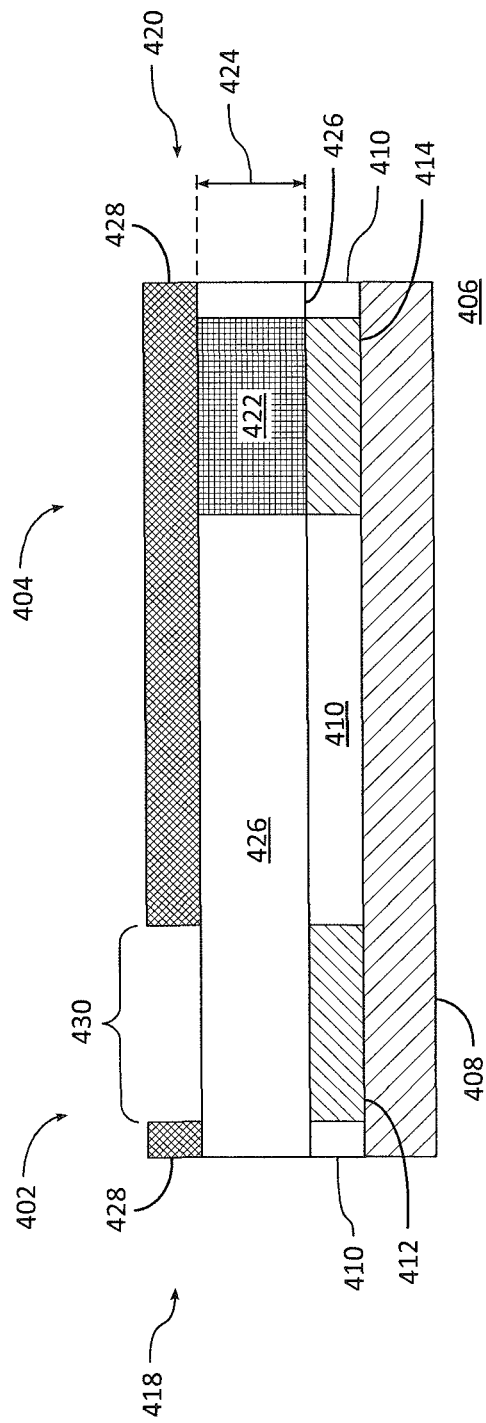
FIG. 4A
FIG. 4B

METHOD OF FORMING A MEMORY AND METHOD OF FORMING A MEMORY ARRAY

CROSS-REFERENCE TO RELATED APPLICATIONS

This is a divisional of application Ser. No. 14/194,897, filed on Mar. 3, 2014, which is hereby incorporated herein by reference in its entirety.

FIELD OF TECHNOLOGY

The present application relates to a method of forming a memory and a method of forming a memory array.

BACKGROUND

The market size for non-volatile memory storage capacity continues to increase at exponential rates. The growth drivers include consumer items such as smart phones, tablets and personal computers. One of the most popular types of non-volatile memory being used for these applications is FLASH memory. One of the advantages of FLASH memory is that it is available in cell configurations such as NAND which provide a very small, one transistor per cell size that in the past has offered excellent scalability or reductions in minimum feature size. Limitations to continued scaling or reductions in minimum feature sizes though are being observed with silicon-based complementary metal oxide semiconductor (CMOS) technologies as they rapidly approach their miniaturization limits. This continued scaling was the result in part of reductions in the thickness of $SiO_2$ gate oxides. Further reductions in $SiO_2$ gate oxide dielectric thickness will result in higher leakage currents due to quantum mechanical tunneling of electrons and holes through the dielectrics that will result in unacceptable overall power consumption levels. Fowler-Nordheim tunneling is the dominate leakage current mechanism for oxides that are thicker than about 2 nanometers (nm). Fowler-Nordheim tunneling can sometimes lead to a soft breakdown of an oxide that is caused by thermal runaway but does not typically result in a permanent leakage path. For oxides that have a thickness less than 2 nm, direct tunneling currents tend to dominate and can lead to a hard breakdown of the oxide. A hard breakdown occurs when the thermal runaway caused by a soft breakdown becomes significant and results in a permanent current conduction path due to an irreversible and catastrophic breakdown of the oxide.

The use of high dielectric constant (e.g., high-k) materials to replace the current $SiO_2$ gate oxide materials is being investigated because these materials can provide continued scaling through further electrical oxide thickness reductions while physical oxide thicknesses are maintained at levels sufficient to keep gate leakage currents low. These higher permittivity dielectric materials provide the higher capacitances necessary for continued scaling but also have hard breakdown voltage levels (expressed as megavolts per centimeter of dielectric material thickness) that are lower than conventional $SiO_2$ gate oxide materials and that may be too low for typical semiconductor applications. A paper by J. McPherson, J. Kim, A. Shanware, H. Mogul and J. Rodriguez, "Proposed Universal Relationship Between Dielectric Breakdown and Dielectric Constant", 2002 IEEE International Electron Device Meeting (IEDM) Technical Digest, pp. 633-636, Dec. 8-11, 2002, San Francisco, USA, has shown that the dielectric breakdown voltage has an inverse relationship with the dielectric constant k for dielectric materials. For 10 dielectric materials studied, the dielectric breakdown voltage strength was shown to decrease as the dielectric constant of the material measured was increased.

High-k dielectric materials are also being investigated for use in new non-volatile memory concepts that also can offer the promise of continued scaling as well as a true one transistor per cell minimum size. These concepts are based on random-access memory resistive switching in high-k metal oxide materials. A tutorial by D. Wouters, "Resistive Switching Devices and Materials for Future Memory Applications", 43rd IEEE Semiconductor Interface Specialists Conference (SISC), San Diego, 5 Dec. 2012, describes the resistive switching concept for a two terminal memory device that includes a metal oxide material positioned between two terminals. The resistive switching behavior can vary depending on the material used and is classified into two types which are unipolar and bipolar. With unipolar resistive switching, the switching depends on the amplitude of a voltage applied to the two terminals but not the polarity. The first time the memory device is switched from a high-resistance state (HRS) to a low-resistance state (LRS), a forming voltage is applied to the terminals to switch the device from a HRS to a LRS. After the forming process, the memory device is switched from a LRS to a HRS by applying a reset voltage and switched from a HRS state to a LRS by applying a set voltage. The forming voltage is equal to or greater than the set voltage and the set voltage is greater than the reset voltage. The forming voltage is proportional to a thickness of the metal oxide and causes what is similar to a soft breakdown in the metal oxide. The forming voltage causes the leakage current through the metal oxide to significantly increase but does not cause permanent damage to the metal oxide. The forming voltage must be less than the hard breakdown voltage for a same material because a hard breakdown is an irreversible and permanent breakdown of the metal oxide. Current compliance is used to control the current through the metal oxide in order to avoid a hard breakdown. With bipolar resistive switching, the switching depends on the polarity of the applied voltage. The forming voltage is equal to or greater in magnitude than the set voltage and they both have the same polarity (e.g., positive). The reset voltage has a polarity that is opposite to the forming and set voltage (e.g., negative) and has a magnitude that is less than a magnitude of the forming voltage.

These new non-volatile memory concepts that are based on resistive switching in high-k metal oxide materials have limited reliability including limited thermal stability due to the early stages of development of the metal oxide materials used. One problem that can result is that memories that use resistive switching, once programmed, can lose information in the presence of high temperatures, such as those required for assembly or soldering of the packaged devices to printed circuit boards. One solution that has been used in an attempt to overcome this problem is to incorporate polysilicon or laser fuses within the memory that can be programmed, for example, to incorporate redundant bits into a memory array that can replace faulty bits. A negative consequence of this solution is that additional circuitry must be used for the redundant bits, fuses and associated control circuitry that will increase the memory die size and negatively impact the scaling benefits that this type of memory can offer.

SUMMARY

According to an embodiment of a memory, the memory includes a first electrode and a second electrode formed within a first layer and includes a third electrode and a fourth electrode formed within a second layer. The memory includes a resistive-switching memory element and an antifuse element. The resistive-switching memory element includes a metal oxide layer and is disposed between the first electrode and the third electrode. The metal oxide layer has a first thickness and a forming voltage that corresponds to the first thickness. The antifuse element includes a dielectric layer and is disposed between the second electrode and the fourth electrode. The dielectric layer has a second thickness that is less than the first thickness and a dielectric breakdown voltage that is less than the forming voltage.

According to an embodiment of a memory array, the memory array includes a first array of first conductors and a second array of second conductors. The memory array includes a plurality of resistive-switching memory cells and a plurality of antifuse cells. Each one of the plurality of resistive-switching memory cells includes a resistive-switching memory device and is coupled between one of the first conductors and one of the second conductors. The resistive switching memory device includes a metal oxide layer that has a first thickness and a forming voltage that corresponds to the first thickness. Each one of the plurality of antifuse cells includes an antifuse device and is coupled between one of the first conductors and one of the second conductors. The antifuse device includes a dielectric layer that has a second thickness that is less than the first thickness and a dielectric breakdown voltage that is less than the forming voltage. The metal oxide layer and the dielectric layer are formed within a same layer within the memory array, and the plurality of resistive-switching memory cells and the plurality of antifuse devices each have a same area within the memory array that is defined by a first conductor pitch and a second conductor pitch.

According to an embodiment of a method of forming a memory, the method includes forming a first electrode and a second electrode within a first layer over a semiconductor substrate, and forming a resistive-switching memory element and an antifuse element over the first layer. The resistive-switching memory element includes a metal oxide layer and is electrically contacting the first electrode. The metal oxide layer has a first thickness and a forming voltage that corresponds to the first thickness. The antifuse element includes a dielectric layer and is electrically contacting the second electrode. The dielectric layer has a second thickness that is less than the first thickness and a dielectric breakdown voltage that is less than the forming voltage. The method further includes forming a third electrode and a fourth electrode within a second layer over the resistive-switching memory element and the antifuse element. The third electrode is electrically contacting the resistive-switching memory element and the fourth electrode is electrically contacting the antifuse element.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A-2C illustrate schematic diagrams of three embodiments of resistive-switching memory cells and antifuse cells.

FIGS. 4A-4C illustrate cross-sectional views of embodiments of a process for forming a resistive-switching memory cell and an antifuse cell.

DETAILED DESCRIPTION

Figure 1:
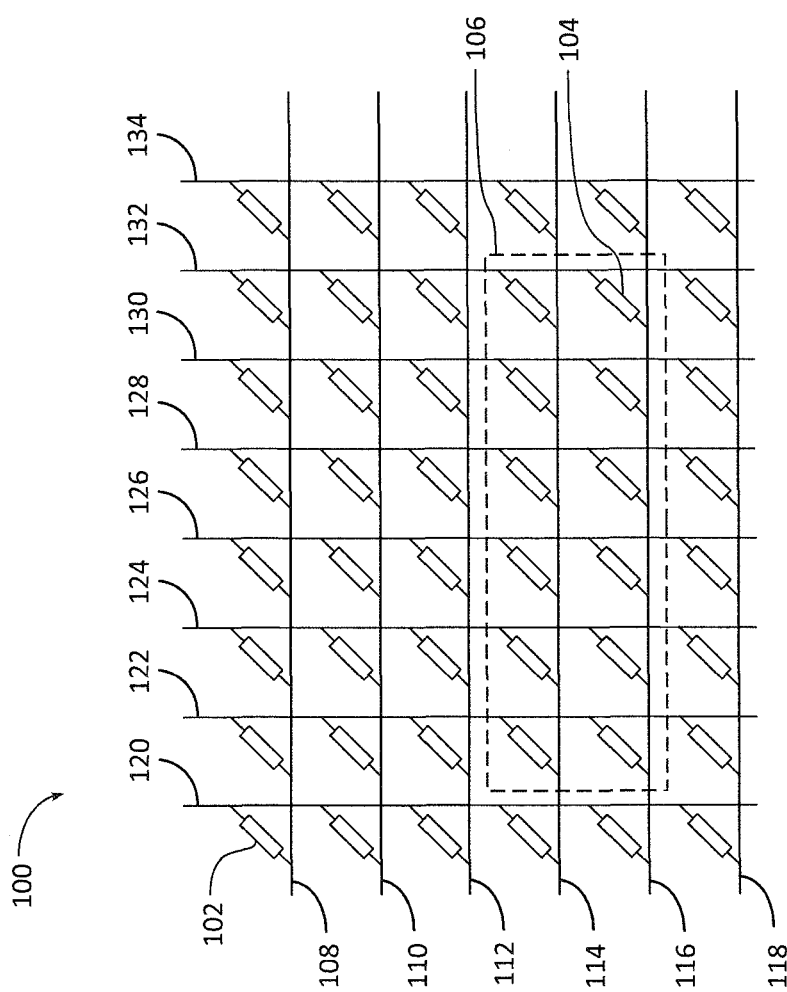
FIG. 1 illustrates a schematic diagram of an embodiment of a memory array that includes resistive-switching memory cells and antifuse cells.

FIG. 1 illustrates a schematic diagram of an embodiment of a memory array 100. The memory array 100 includes includes resistive-switching memory cells 102 and antifuse cells 104. In the illustrated embodiments, resistive-switching memory cells 102 and antifuse cells 104 are non-volatile memory cells. The antifuse cells 104 are located within an area designated at 106 and cells located outside of area 106 are resistive-switching memory cells 102. Although a limited number of resistive-switching memory cells 102 and antifuse cells 104 are illustrated in FIG.1, in other embodiments, memory array 100 can include any suitable number of resistive-switching memory cells 102 and antifuse cells 104. In other embodiments, area 106 can include only one antifuse cell 104 or more than one antifuse cell 104. In other embodiments, there can be two or more areas 106 that each include one or more antifuse cells 104.

In the illustrated embodiment, memory array 100 includes row lines 108, 110, 112, 114, 116, 118. Memory array 100 also includes column lines 120, 122, 124, 126, 128, 130, 132 and 134 which intersect row lines 108-118. Row lines 108-118 and column lines 120-134 may also be referred to, respectively, as word lines 108-118 and bit lines 120-134. Each one of the resistive-switching memory cells 102 or antifuse cells 104 can be selected or accessed and read or written via suitable voltage levels or current levels applied between one of rows 108-118 and one of columns 120-134, wherein the selected resistive-switching memory cell 102 or antifuse cell 104 resides at an intersection of the selected one of the rows 108-118 and the selected one of the columns 120-134. Although not illustrated in FIG. 1, a number of suitable architectures or configurations of row decode and column decode circuitry can be coupled respectively to rows 108-118 and columns 120-134 in order to apply the voltage levels or current levels to the selected one or more of rows 108-118 and columns 120-134. In various embodiments, one or more resistive-switching memory cells 102 or one or more antifuse cells 104 can be accessed at a same time.

In the embodiments described herein, resistive-switching memory cells 102 can be formed using many different materials and processes. In one embodiment, resistive-switching memory cells 102 can be changed to indicate two levels of resistance where one of the levels corresponds to a high-resistance state (HRS) or a binary "1" and the other level of resistance corresponds to a low-resistance state (LRS) or a binary "0". In other embodiments, resistive-switching memory cells 102 can be changed to indicate more than two levels of resistance, wherein each resistance level corresponds to a resistance state of resistive-switching memory cell 102. For example, if four resistance levels are stored in resistive-switching memory cell 102, than the four resistance levels can be represented by binary states such as "00", "01", "10" and "11".

In the illustrated embodiments, antifuse cells 104 are formed using the same or different materials as described herein. Antifuse cells 104 are programmable only once meaning they can be changed only once from a HRS (e.g., corresponding to a binary "1") to a LRS (e.g., corresponding to a binary "0").

FIGS. 2A-2C illustrate schematic diagrams of three embodiments at 200, 202 and 204 of resistive-switching memory cells 102 and antifuse cells 104 within memory array 100. Cells 200, 202 and 204 each include a storage device 206. If storage device 206 is a resistive-switching memory device, the respective cell 200, 202 or 204 is a resistive-switching memory cell 102. If storage device 206 is an antifuse device, the respective cell 200, 202 or 204 is an antifuse cell 104. Resistive-switching memory devices and antifuse devices are discussed in greater detail in FIGS. 4A-4C through FIG. 8.

In the embodiments illustrated for cells 200, 202 and 204, the resistance levels of device 206 correspond to recognizable resistance levels that enable information to be stored in cells 200, 202 and 204. These resistance levels can be measured and correspond, within certain threshold limits or range of resistance values, to information that is stored within the cells 200, 202 and 204 (e.g., a HRS or binary "1" or a LRS or binary "0").

This information can be determined by measuring or sensing a resistance level of device 206 via one of a selected row line 108-118 (illustrated at 208), and one of a selected column line 120-134 (illustrated at 210), via suitable read circuits and row decode and column decode circuits. Cells 202 and 204 include selector devices which are, respectively, diode 218 and transistor 220. Selector devices 218 and 220 serve to minimize leakage currents through device 206 when cell 202 or cell 204 is not selected and therefore not being read or written. In other embodiments, other suitable selector devices can be used within cells 202 or 204. Cell 200 does not include a selector device coupled to device 206 between row line 208 and column line 210. In the illustrated embodiments, cell 200 includes a selector device that is external to memory array 100.

In the illustrated embodiments, device 206 stores one of two resistive states which are a HRS or a LRS. Changing device 206 from a HRS to a LRS is referred to as a set transition which is accomplished by selectively applying a set voltage to device 206. A forming voltage which is equal to or greater than the set voltage is applied to device 206 the first time that device 206 is switched from a HRS to a LRS. The reverse transition of device 206 from a LRS to a HRS is referred to as a reset transition which is accomplished by selectively applying a reset voltage to device 206. In different embodiments, in accordance with the materials and processes used to form device 206, the forming, set and reset voltages can be of the same polarity (e.g., the forming voltage, set voltage and the reset voltage are all positive), or can be of opposite polarity (e.g., the forming voltage and set voltage are positive and the reset voltage is negative). If storage device 106 is an antifuse device 104, the transition of storage device 106 from a HRS to a LRS can be accomplished by applying a programming voltage to storage device 106.

In the embodiments illustrated for cells 200, 202 and 204, storage device 206 can be fabricated using back end of the line (BEOL) processing known to those skilled in the art. In various embodiments, selector devices 218 and 220 can be fabricated using either front end of the line (FEOL) processing or BEOL processing known to those skilled in the art. In the embodiment described for cell 202, selector device 218 is fabricated using BEOL processing. In the embodiment described for cell 204, selector device 220 is fabricated using FEOL processing.

In the embodiments illustrated for cells 200, 202 and 204, storage device 206 includes an electrode 212, an electrode 214 and a material layer 216 between and electrically coupled to electrode 212 and electrode 214. In the illustrated embodiments, material layer 216 is a metal oxide layer if the respective cell 200, 202 or 204 is a resistive-switching memory cell 102, and material layer 216 is a dielectric layer that is the same as or different than the metal oxide layer if the respective cell 200, 202 or 204 is an antifuse cell 104. In various embodiments, the dielectric layer for antifuse 104 can include multiple dielectric layers that are formed from any suitable combination of metal oxide and/or silicon dioxide ($SiO_2$) materials.

Figure 3C:
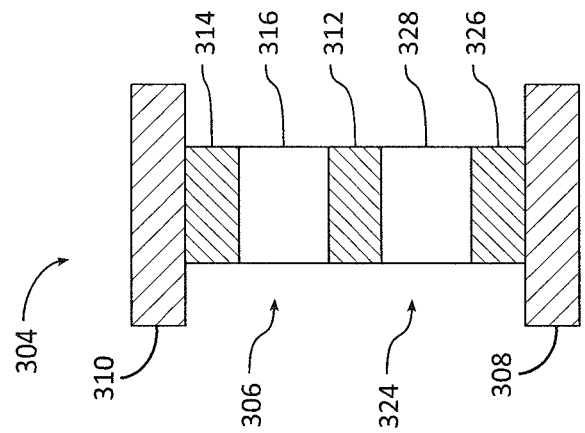
FIGS. 3C-3D illustrate cross-sectional views of the two embodiments of resistive-switching memory cells and antifuse cells illustrated, respectively, in FIGS. 2B-2C.
Figure 3B:
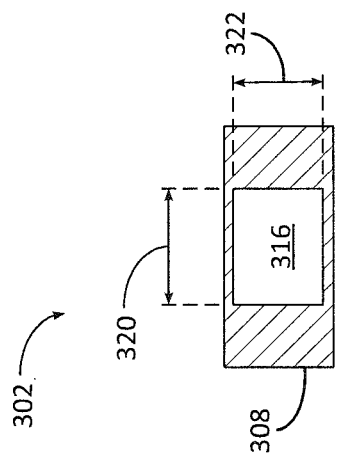
FIGS. 3A-3B illustrate a cross-sectional view and a top plan view, respectively, of the embodiment of resistive-switching memory cells and antifuse cells illustrated in FIG. 2A.
Figure 3A:
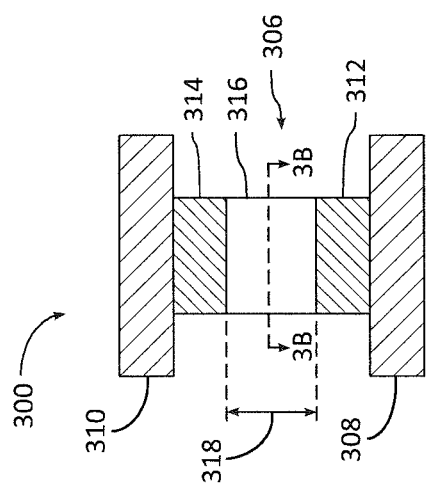

FIGS. 3A-3B illustrate a cross-sectional view at 300 and a top plan view at 302 of the embodiment of cell 200 in FIG. 2A. Referring to FIG. 3A, an embodiment is illustrated at 300 wherein storage device 306 is coupled between two conductors or electrodes illustrated at 308 and 310. In this embodiment, first conductor 308 corresponds to one of row lines 108-118 and second conductor 310 corresponds to one of column lines 120-134 for memory array 100. Each intersection of row lines 108-118 and column lines 120-134 defines a two-terminal cell which is either a two-terminal resistive-switching memory cell 102 or a two terminal antifuse cell 104. In this embodiment, BEOL processing is used to create a pillar type or vertical configuration for storage device 306 as illustrated in FIG. 3A. In one embodiment, first conductor 308 is formed within a first metal layer and second conductor 310 is formed within a second metal layer. The first metal layer is formed over an insulating layer such as $SiO_2$ that is formed over a wafer substrate using a process such as chemical-vapor deposition (CVD). In other embodiments, first conductor 308 or row lines 108-118 and second conductor 310 or column lines 120-134 can be formed within other metal layers, such as within, respectively, a third metal layer and a fourth metal layer (not shown).

Storage device 306 includes an electrode 312 which is electrically coupled to first conductor 308. Electrode 312 forms an electrically conductive contact between first conductor 308 and material layer 316. Electrode 312 may be formed from suitable materials such as titanium nitride (TiN). Storage device 306 includes an electrode 314 which is electrically coupled to second conductor 310. Electrode 314 forms an electrically conductive contact between second conductor 310 and material layer 316. Electrode 314 may be formed from suitable materials such as TiN. Material layer 316 has a thickness illustrated at 318 which represents a spacing between electrodes 312 and 314.

Referring to FIG. 3B, a top plan view is illustrated at 302 of the embodiment of cell 300 illustrated in FIG. 3A. Material layer 316 has a dimension illustrated at 320 and a dimension illustrated at 322 which together define a cross-sectional area of material layer 316. A volume of material layer 316 is defined by thickness 318 together with dimensions 320 and 322.

Figure 3D:
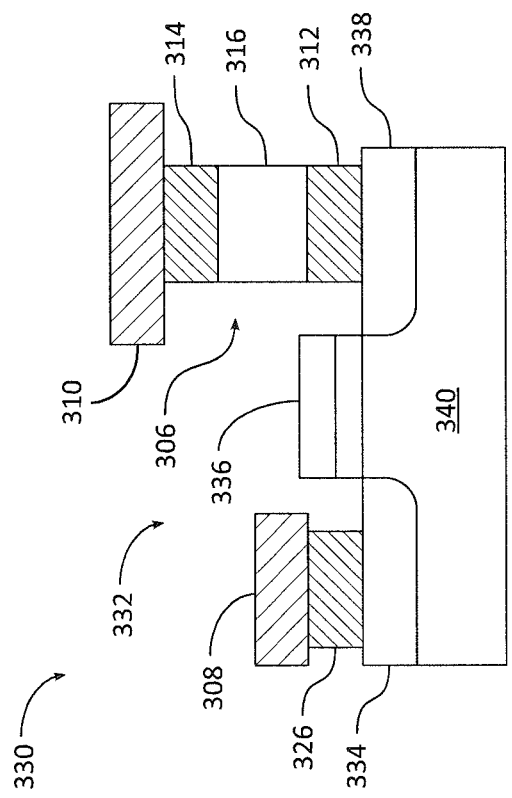

FIGS. 3C-3D illustrate cross-sectional views at 304 and 330, respectively, of the embodiments of cells 202 and 204 in FIGS. 2B-2C. Referring to FIG. 3C, an embodiment is illustrated at 304 wherein storage device 306 is coupled in series with selection device 324 and the series combination is coupled between first conductor 308 and second conductor 310. In this embodiment, first conductor 308 corresponds to one of row lines 108-118 and second conductor 310 corresponds to one of column lines 120-134 for memory array 100. Each intersection of row lines 108-118 and column lines 120-134 defines a two-terminal cell which is either a two-terminal resistive-switching memory cell 102 or a two terminal antifuse cell 104. In this embodiment, BEOL processing is used to create a pillar type or vertical configuration for storage device 306 and selection device 324 as illustrated in FIG. 3C. First conductor 308 is formed within a first metal layer and second conductor 310 is formed within a second metal layer. In other embodiments, first conductor 308 or row lines 108-118 and second conductor 310 or column lines 120-134 can be formed within other metal layers, such as within, respectively, a third metal layer and a fourth metal layer (not shown).

In the illustrated embodiment, selection device 324 is a P-N diode 324 (refer also to diode 218 in FIG. 2B). In other embodiments, diode 324 can be a P-I-N, N-P or N-I-P diode or can be formed from two diodes such as a P-N diode and an N-P diode. In the illustrated embodiment, material layer 328 is formed from a P layer and an N layer wherein the P layer portion of material layer 328 is coupled to electrode 326 and the N layer portion of material layer 328 is coupled to electrode 312. Electrode 326 forms an electrically conductive contact between first conductor 308 and material layer 328. Electrode 326 may be formed from suitable materials such as TiN. Electrode 312 for the purposes of illustration in FIG. 3C is shared with diode 324 and storage device 306 and forms an electrically conductive contact between material layer 328 and material layer 316. Electrode 312 may be formed from suitable materials such as TiN. Storage device 306 includes an electrode 314 which is electrically coupled to second conductor 310. Electrode 314 forms an electrically conductive contact between second conductor 310 and material layer 316. Electrode 314 may be formed from suitable materials such as TiN.

FIG. 3D illustrates an embodiment at 330 wherein storage device 306 is coupled in series with selection device 332 and the series combination is coupled between first conductor 308 and second conductor 310. In this embodiment, first conductor 308 corresponds to one of row lines 108-118 and second conductor 310 corresponds to one of column lines 120-134 for memory array 100. The series combination of storage device 306 and selection device 332 between first conductor 308 and second conductor 310 defines a cell which can operate as a resistive-switching memory cell 102 or an antifuse cell 104. In this embodiment, BEOL processing is used to create a pillar type or vertical configuration for storage device 306 and FEOL processing is used to form selection device 332 as illustrated in FIG. 3D. In this embodiment, selection device 332 is an n-channel MOSFET. In other embodiments, selection device 332 can be a p-channel MOSFET, a bipolar transistor, or another suitable type of transistor. first conductor 308 is formed within a first metal layer and second conductor 310 is formed within a second metal layer. In other embodiments, one or more of first conductor 308 or row lines 108-118 and second conductor 310 or column lines 120-134 can be formed within other metal layers, such as within third metal layers and fourth metal layers (not shown).

In the illustrated embodiment, storage device 306 includes an electrode 312 which is electrically coupled to a drain 338 of n-channel MOSFET 332. Electrode 312 forms an electrically conductive contact between drain 338 and material layer 316. In various embodiments, electrode 312 may be a contact 312 and may be formed from suitable materials such as TiN. Storage device 306 includes an electrode 314 which is electrically coupled to second conductor 310. Electrode 314 forms an electrically conductive contact between second conductor 310 and material layer 316. Electrode 314 may be formed from suitable materials such as TiN. N-channel transistor 332 also includes a gate 336 and a source 334. Gate 336 is coupled to a control line (not illustrated) that enables n-channel transistor to be selected thereby electrically coupling storage device 306 between first conductor 308 and second conductor 310. Electrode 326 forms an electrically conductive contact between source 334 and first conductor 308. In various embodiments, electrode 326 may be a contact 326 and may be formed from suitable materials such as TiN. N-channel transistor 332 is formed within a substrate 340. Substrate 340 can be formed in a conventional silicon wafer as well as in other structures that include semiconductor materials or semiconductive material layers.

In the illustrated embodiments, material layer 316 can be manufactured from a variety of materials if the respective cell 200, 202 or 204 is for resistive-switching memory cell 102 or antifuse cell 104. This includes a metal oxide layer or material for resistive-switching memory cell 102 or a metal oxide layer or material or a dielectric layer or material for antifuse cell 104. The material layer 316 for either or both of resistive-switching memory cell 102 and antifuse cell 104 can include multiple dielectric layers that are formed from any suitable combination of materials for material layer 316 as described herein. In some embodiments, material layer 316 is a metal chalcogenide which is a compound made from a metallic element and a chalcogen such as oxygen, sulfur, selenium or tellurium. Metal chalcogenides formed with oxygen can also be referred to as metal oxides. A metal oxide formed using a metallic element that is a transition metal is a transition metal oxide. In the illustrated embodiments, transition metals are elements within the d-block of the periodic table of the elements which includes groups 3 to 12. In various embodiments, material layer 316 can be formed from metal oxides that include aluminum oxide ($Al_2O_3$) and magnesium oxide (MgO). Other metal oxides or derivatives of $Al_2O_3$ and MgO include AlxOy and MgxOy. For all chemical compounds described herein, derivatives include compounds using any suitable number of atoms to form the compound. For example, derivatives of $Al_2O_3$ are indicated as AlxOy. In other embodiments, other suitable metal oxides can be used to form material layer 316. Embodiments of material layer 316 that are formed using transition metal oxides use transition metal oxides because they have two or multiple oxidation states and are good ionic conductors. In various embodiments, material layer 316 can be formed from transition metal oxides that include nickel oxide (NiO), hafnium oxide ($HfO_2$), niobium oxide ($Nb_2O_5$), titanium oxide (TiO), chromium dioxide ($CrO_2$) and vanadium oxide ($VO_2$). Other transition metal oxides or derivatives include $Co_xO_y$, $Cr_xO_y$, $Hf_xO_y$, $Nb_xO_y$, $Ni_xO_y$, $Ti_xO_y$, $V_xO_y$, $Zn_xO_y$ and $Zr_xO_y$. In other embodiments, other suitable transition metal oxides can be used to form material layer 316.

In the illustrated embodiments, material layer 316 can be manufactured from a variety of materials if the respective cell 200, 202 or 204 is an antifuse cell 104. In some embodiments, material layer 316 for antifuse 104 is a silicon dielectric material. This silicon dielectric material can include silicon (Si) or any suitable material derived from Si. In embodiments where material layer 316 is a silicon oxide layer, the silicon oxide can be either thermally grown or deposited. Thermally grown silicon oxide can be formed by dry oxidation, wet oxidation, plasma enhanced oxidation, chemical oxidation or electrochemical oxidation through methods known to one skilled in the art. A silicon oxide layer that is deposited can be formed using deposition methods such as CVD or sputtering. In other embodiments for material layer 316, materials such as amorphous silicon can be deposited through methods known to one skilled in the art. In the illustrated embodiments, material layer 316 can be formed from one or more materials that include polysilicon, amorphous silicon (a-Si), silicon dioxide ($SiO_2$), silicon nitride ($Si_3N_4$), silicon carbide (SiC), silicon oxynitride (SiON), as well as any combination or derivative of these materials. In other embodiments, material layer 316 can be formed from other suitable materials.

In the illustrated embodiments, material layer 316 has dimensions at 320 and 322 that define a cross-sectional area of material layer 316. In some embodiments, material layer 316 has the same cross-sectional area for metal oxide layers 426 for resistive-switching memory devices 418 within resistive-switching memory cells 402, and for dielectric layer 422 for antifuse device 420 within antifuse cell 404 within a memory array 100 (see also, FIG. 4C). In other embodiments, the cross-sectional areas for metal oxide layers 426 and for dielectric layers 422 are not the same.

Figure 4C:
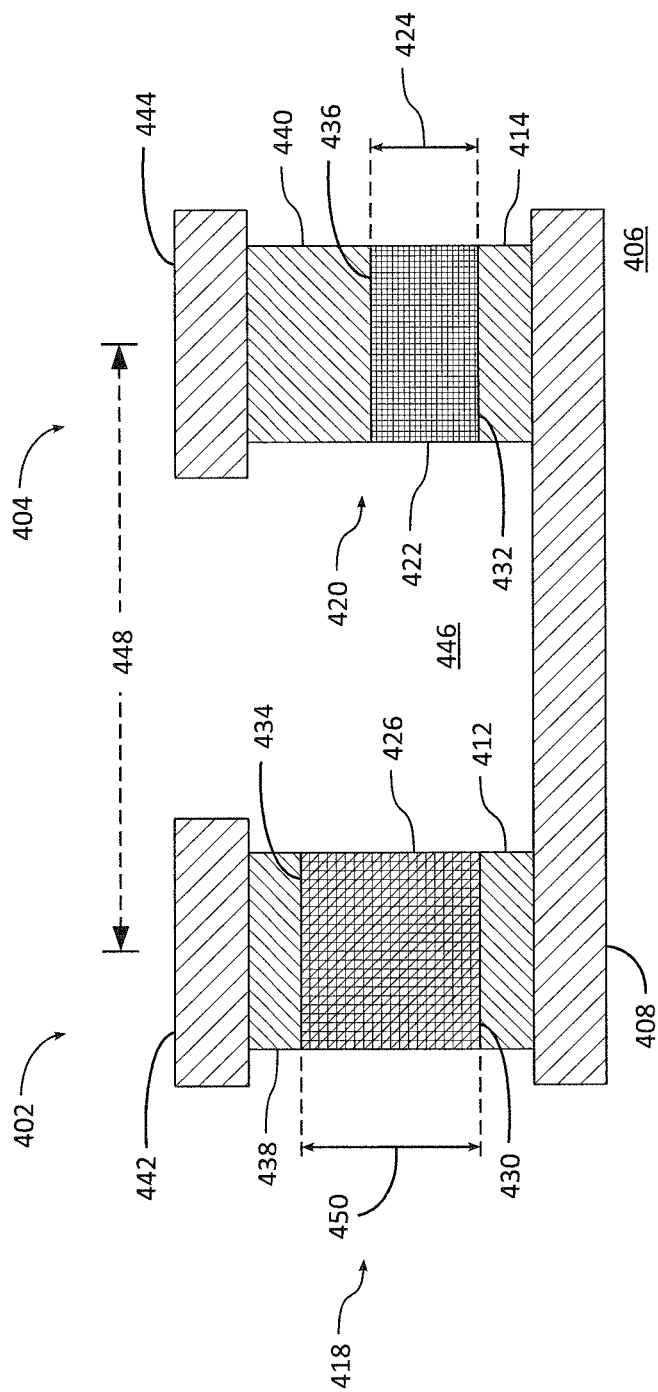

FIGS. 4A-4C illustrate cross-sectional views of embodiments of a process at 400 for forming a resistive-switching memory cell 402 and an antifuse cell 404. Referring to FIG. 1, resistive-switching memory cell 402 corresponds to a cell 102 located outside of area 106 within memory array 100 and antifuse cell 404 corresponds to a cell 104 located within area 106 and adjacent to and coupled to a same one of the row lines 108-118 as resistive-switching memory cell 402. In one embodiment, for illustration purposes, resistive-switching memory cell 402 corresponds to a cell 102 located at the intersection of row line 114 and column line 120 and antifuse cell 404 corresponds to a cell 104 located at the intersection of row line 114 and column line 122. The embodiments illustrated at 400 for resistive-switching memory cell 402 and antifuse cell 404 correspond to the cell embodiments illustrated at 200 in FIG. 2A and at 300 in FIG. 3A.

Referring to FIG. 4A, resistive-switching memory cell 402 and antifuse cell 404 are formed over a semiconductor substrate 406. Resistive-switching memory cell 402 includes a resistive-switching memory device 418 and antifuse cell 404 includes an antifuse device 420. Semiconductor substrate 406 is a silicon substrate in the illustrated embodiment. In other embodiments, other semiconductor materials such as III-V type semiconductor compounds can be used for substrate 406. In other embodiments, substrate 406 is an insulating substrate.

In the illustrated embodiment, substrate 406 includes a dielectric layer (not shown) such as $SiO_2$ that is formed over a top surface of substrate 406 by a process such as a CVD process. A first array of first conductors 408 is patterned and formed over the dielectric layer overlying substrate 406. One first conductor 408 is illustrated in FIG. 4A. First conductor 408 corresponds to one of the row lines 108-118 and is formed within a first metal layer. In other embodiments, first conductor 408 can be formed within other suitable metal layers.

In the illustrated embodiment, a plurality of resistive-switching memory cells 402 and a plurality of antifuse cells 404 are formed over a first array of first conductors 408. Each resistive-switching memory cell 402 includes a resistive-switching memory device 418 and each antifuse cell 404 includes an antifuse device 420. Resistive-switching memory device 418 includes a first electrode 412 and antifuse device 420 includes a second electrode 414. Electrodes 412 and 414 are patterned and formed within an interlayer dielectric layer 410 or first layer to be over first conductor 408 and in conductive contact with first conductor 408. Electrodes 412 and 414 can be formed using suitable deposition techniques and suitable materials such as TiW. A top surface illustrated at 416 over electrodes 412 and 414 and over dielectric layer 410 is planarized using methods known in the art.

Referring to FIG. 4B, antifuse element 422 which is a dielectric layer 422 is formed over top surface 416 which includes electrode 412 and electrode 414. Dielectric layer 422 can be formed using suitable materials and methods as described herein. These materials include NiO, $HfO_2$, $Nb_2O_5$, TiO, $CrO_2$, $VO_2$, $Al_2O_3$, MgO and any combination or derivative of these materials. These materials can also include $SiO_2$, $Si_3N_4$, SiC and SiON, and any combination or derivative of these materials.

In one embodiment, dielectric layer 422 is etched and removed from areas over top surface 416 that are not over electrode 412. Resistive-switching memory element 426 or metal oxide layer 426 is formed over the areas of surface 416 that are not over electrode 412. The materials used to form metal oxide layer 426 can include any materials described herein which includes NiO, $HfO_2$, $Nb_2O_5$, TiO, $CrO_2$, $VO_2$, $Al_2O_3$, MgO and any combination or derivative of these materials. Both metal oxide layer 426 and dielectric layer 422 are formed to a second thickness indicated at 424. Next, a protective layer 428 is formed over metal oxide layer 426 and dielectric layer 422. Protective layer 428 can be formed using photoresist or another suitable material. Protective layer 428 is patterned and etched to remove the portion indicated at 430 that overlies electrode 412.

Referring also to FIG. 4C, metal oxide layer 426 is additionally formed to a first thickness indicated at 450. Resistive-switching memory device 418 will have a forming voltage that corresponds to the first thickness 450. The second thickness 424 of dielectric layer 422 is less than the first thickness 450 and a dielectric breakdown voltage of dielectric layer 422 is less than the forming voltage for resistive-switching memory device 418. In some embodiments, metal oxide layer 426 and dielectric layer 422 are formed from the same material as described herein. In some embodiments, metal oxide layer 426 and dielectric layer 422 are formed from different materials as described herein. Resistive-switching memory device 418 includes metal oxide layer 426 which is electrically contacting first conductor 408 via first electrode 412 and antifuse device 420 includes dielectric layer 422 which is electrically contacting first conductor 408 via second electrode 414. In other embodiments, first electrode 412 and second electrode 414 are not used and metal oxide layer 426 at 430 is electrically coupled directly to first conductor 408 in place of electrode 412, and dielectric layer 422 at 432 is electrically coupled directly to first conductor 408 in place of second electrode 414.

In the illustrated embodiment, resistive-switching memory device 418 includes a third electrode 438 and antifuse device 420 includes a fourth electrode 440. Third electrode 438 and fourth electrode 440 are formed within a second layer over, respectively, metal oxide layer 426 and dielectric layer 422. Third electrode 438 and fourth electrode 440 can be formed using suitable deposition techniques and suitable materials such as TiW. Third electrode 438 is formed to be in vertical alignment with first electrode 412 and provides a conductive contact to metal oxide layer 426 at 434. Fourth electrode 440 is formed to be in vertical alignment with second electrode 414 and provides a conductive contact to dielectric layer 422 at 436.

In the illustrated embodiment, a second array of second conductors is formed over the plurality of resistive-switching memory devices (illustrated as resistive-switching memory device 418) and over the plurality of antifuse devices (illustrated as antifuse device 420). The second conductors are respectively illustrated in FIG. 4C as second conductor 442 that is patterned and formed over and in conductive contact with third electrode 438 and second conductor 444 that is patterned and formed over and in conductive contact with fourth electrode 440. Second conductor 442 corresponds to one of column lines 120-134 and second conductor 444 corresponds to another adjacent one of column lines 120-134. In the illustrated embodiment, second conductors 442 and 444 are formed within a second metal layer. In other embodiments, second conductors 442 and 444 can be formed within other suitable metal layers. In one exemplary embodiment, first conductor 408 is formed within a third metal layer and second conductors 442 and 444 are formed within a fourth metal layer. In other embodiments, third electrode 438 and fourth electrode 440 are not used and metal oxide layer 426 at 434 is electrically coupled directly to second conductor 442 in place of third electrode 438 and dielectric layer 422 at 436 is electrically coupled directly to second conductor 444 in place of fourth electrode 440.

In the illustrated embodiment, each one of the plurality of resistive-switching memory devices 418 is electrically contacting a second conductor 442 and a first conductor 408 and defines a two-terminal resistive-switching memory cell 402. Each one of the plurality of antifuse devices 420 is electrically contacting a second conductor 444 and a first conductor 408 and defines a two-terminal antifuse cell 404. For ease of illustration, all intervening dielectric layers between resistive-switching memory device 418 and antifuse device 420, such as dielectric layer 410, are collectively illustrated at 446.

In the embodiment illustrated in FIG. 4C and for other embodiments described herein, second thickness 424 of dielectric layer 422 is less than first thickness 450 of metal oxide layer 426. A spacing between resistive-switching memory cell 402 or resistive-switching memory device 418 and an adjacent antifuse cell 404 or antifuse device 420, is illustrated at 448. Spacing 448 represents a distance or spacing between a resistive-switching memory cell 402 and an antifuse cell 404 that are located on a same one of the row lines 108-118 (see also, FIG. 1). In FIG. 4C, this same one of the row lines 108-118 is illustrated as first conductor 408. This spacing 448 or first conductor pitch is the same if it is between two adjacent resistive-switching memory cells 402 or between two adjacent antifuse cells 404, that are also located on the same one of the row lines 108-118. Spacing 448 can also represent a spacing between a resistive-switching memory cell 402 or resistive-switching memory device 418, and an adjacent antifuse cell 404 or antifuse device 420, that are located on a same one of the column lines 120-134 (see also, FIG. 1). In FIG. 4C, this same one of the column lines 120-134 could be either second conductor 442 or second conductor 444. In the illustrated embodiments, the spacing 448 or second conductor pitch is the same if it is between two adjacent resistive-switching memory cells 402 or resistive-switching memory devices 418, or between two adjacent antifuse cells 404 or antifuse devices 420, that are also located on the same one of the column lines 120-134.

In the illustrated embodiments, the spacing 448 between cells (402 or 404) or between devices (418 or 420) that are sharing the same one of the row lines 108-118 is the same and the spacing 448 between cells (402 or 404) or between devices (418 or 420) that are sharing the same one of the column lines 120-134 is the same. In some embodiments, the spacing 448 between cells (402 or 404) or between devices (418 or 420) that are sharing the same one of the row lines 108-118 is not the same as the cell spacing 448 between cells (402 or 404) or between devices (418 or 420) that are sharing the same one of the column lines 120-134.

As discussed above, resistive-switching memory cells 102 or antifuse cells 104 can be selected or accessed and read or written via suitable voltage levels or current levels applied between one of rows 108-118 and one of columns 120-134, wherein the selected resistive-switching memory cell 102 or antifuse cell 104 resides at an intersection of the selected one of the rows 108-118 and the selected one of the columns 120-134. Referring to FIG. 4C, resistive-switching memory cell 402 can be read or written via second conductor 442 and first conductor 408, and antifuse cell 404 can be read or written via second conductor 444 and first conductor 408.

Resistive-switching memory cell 402 can be switched to indicate two levels of resistance where one level corresponds to a high-resistance state HRS or a binary "1" and the other level corresponds to a low-resistance state LRS or a binary "0". The first time resistive-switching memory cell 402 is switched from a HRS to a LRS, a forming voltage is applied across second conductor 442 and first conductor 408 to switch resistive-switching memory cell 402 from a HRS to a LRS. After the forming process, resistive-switching memory cell 402 is switched from a LRS to a HRS by applying a reset voltage across second conductor 442 and first conductor 408, and switched from a HRS state to a LRS by applying a set voltage across second conductor 442 and first conductor 408. As discussed above, the forming voltage is equal to or greater in magnitude than the set voltage and the set voltage is greater in magnitude than the reset voltage. The forming voltage is proportional to first thickness 450 of metal oxide layer 426 and does not cause permanent damage to the metal oxide. The forming voltage must be less than the hard breakdown voltage of metal oxide layer 426 because a hard breakdown is an irreversible and catastrophic breakdown of the metal oxide.

Antifuse cell 404 can be programmed or switched one time from a HRS or a binary "1" to a LRS or a binary "0". Antifuse cell 404 is switched from a HRS to a LRS by application of a suitable programming voltage across second conductor 444 and first conductor 408 that is sufficient to cause a dielectric breakdown of dielectric layer 422. For a given dielectric layer 422, the programming or hard breakdown voltage for antifuse device 420 will increase as the second thickness 424 of dielectric layer 422 is increased. The programming voltage will cause permanent damage to dielectric layer 422 thereby causing antifuse device 420 to permanently remain in a LRS.

The D. Wouters tutorial paper discussed above illustrates on page page 43 the scaling of forming voltage with thickness for a metal oxide layer formed from NiO. This figure shows a positive slope for forming voltage versus thickness that is approximately 0.3 volts/nanometer. A paper by T. Diokh, E. Le-Roux, J. F. Nodin, S. Jeannot, M. Gros-Jean, L. Perniola, V. Jousseaume, H. Grampeix, T. Cabout, E. Jalaguier, M. Guillermet, B. De Salvo and P. Candelier, "Investigation of the Impact of the Oxide Thickness and RESET conditions on Disturb in $HfO_2$-RRAM integrated in a 65 nm CMOS", Leti Innovation Days Memory Workshop, Jun. 27, 2013, illustrates on page 7 the current/voltage test results for a metal oxide layer formed from $HfO_2$. This result shows a forming voltage of approximately approximately 3 volts for a 10 nanometer $HfO_2$ thickness. This result also illustrates a positive slope for forming voltage versus thickness that is approximately 0.2 volts/nanometer.

The McPherson et al. paper discussed above illustrates a comparison result for 10 dielectric materials where the dielectric breakdown voltage strength of a material was shown to decrease as the dielectric constant k increases. Two of the dielectric materials studied were $HfO_2$ and $TiO_2$. $HfO_2$ was shown to have a dielectric constant k of 21 and a breakdown voltage of about 4 megavolts/centimeter or 0.4 volts/nanometer. $TiO_2$ was shown to have a dielectric constant k of 60-95 and a breakdown voltage (at k=60) of about 2 megavolts/centimeter or 0.2 volts/nanometer.

Referring to FIG. 4C, resistive-switching memory device 418 has a forming voltage that corresponds to the first thickness 450. In one exemplary embodiment, metal oxide layer 426 and dielectric layer 422 both comprise $HfO_2$. For a first thickness 450 of 10 nanometers, $HfO_2$ has been shown above to have a forming voltage of 3 volts that corresponds to the first thickness 450 of 10 nanometers. For a second thickness 424 of 5 nanometers, $HfO_2$ has been shown above to have a breakdown voltage of 0.4 volts/nanometer which corresponds to 2 volts. In this embodiment, dielectric layer 422 has a second thickness 424 of 5 nanometers that is less than the first thickness 450 of 10 nanometers and has a dielectric breakdown voltage of 2 volts that is less than the forming voltage of 3 volts.

Figure 5:
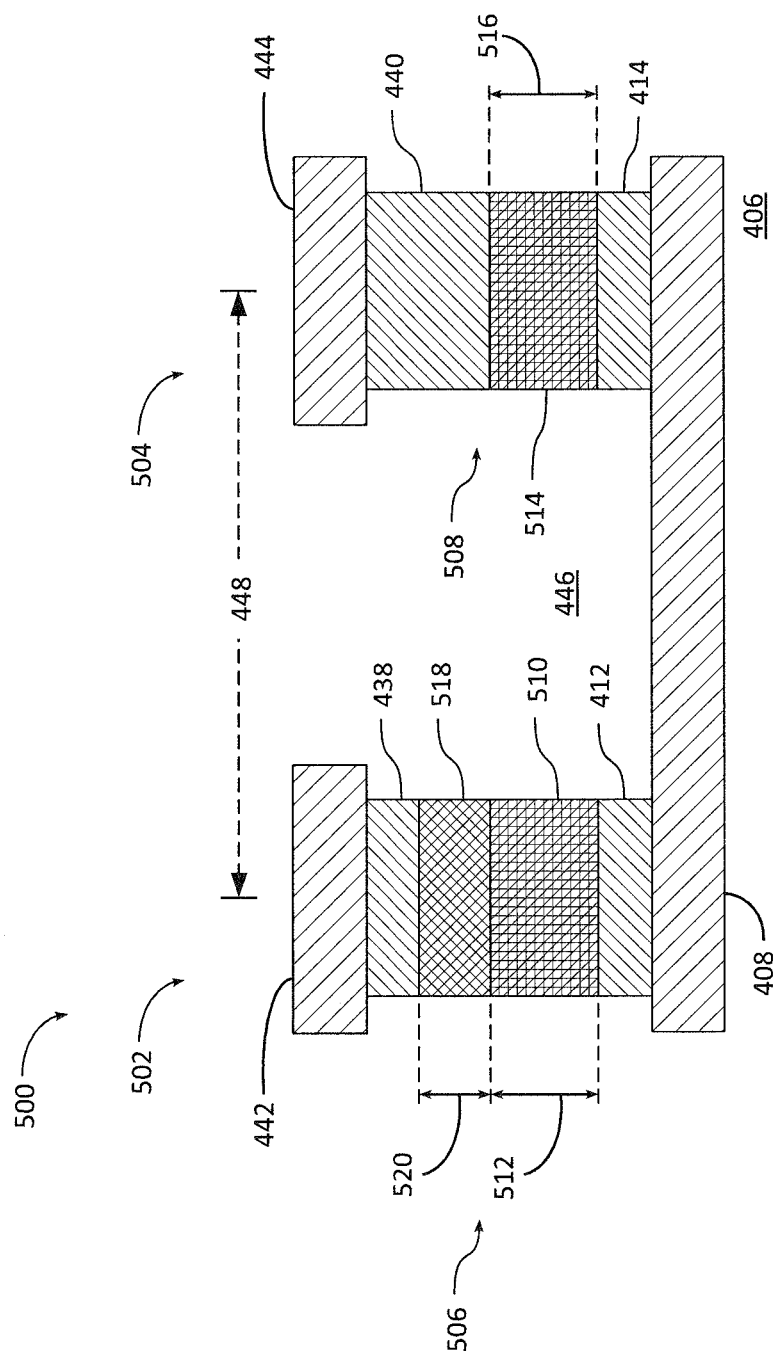
FIG. 5 illustrates a cross-sectional view of an embodiment of a resistive-switching memory cell and an antifuse cell.

FIG. 5 illustrates a cross-sectional view of an embodiment at 500 of a resistive-switching memory cell 502 and an antifuse cell 504. The process for forming resistive-switching memory cell 502 and antifuse cell 504 begins after the process sequence illustrated in FIG. 4A is complete. Resistive-switching memory cell 502 includes a resistive-switching memory device 506 and antifuse cell 504 includes an antifuse device 508. Referring also to FIGS. 4A-4C, a metal oxide layer indicated at 510 and 514 is formed over top surface 416 to have the second thickness indicated at 512 and 516. Second thickness 512 is equivalent to second thickness 516. Metal oxide layer 510 and 514 are illustrated after being patterned and etched. Metal oxide layer 510 is formed over and is in contact with first electrode 412 and metal layer 514 is formed over and is in contact with second electrode 414. Metal oxide layer 510 and 514 are formed using the same material and methods as described herein. These materials include any material described herein which includes NiO, $HfO_2$, $Nb_2O_5$, TiO, $CrO_2$, $VO_2$, $Al_2O_3$, MgO and any combination or derivative of these materials. A second metal oxide layer 518 is formed over the first electrode 412 and over metal oxide layer 512. The first metal oxide layer 510 within resistive-switching memory device 506 has the thickness indicated at 512 and the second metal oxide layer 518 has a thickness indicated at 520. Thickness 512 and thickness 520 have a combined thickness over first electrode 412 that is equal to the first thickness 450 (see also, FIG. 4C). Metal oxide layer 518 can be formed from the same material as metal oxide layer 510 and metal oxide layer 514, or can be formed from a different material than metal oxide layer 510 and metal oxide layer 514. These materials include any material described herein which includes NiO, $HfO_2$, $Nb_2O_5$, TiO, $CrO_2$, $VO_2$, $Al_2O_3$, MgO and any combination or derivative of these materials.

In the illustrated embodiment, resistive-switching memory device 506 includes a third electrode 438 and antifuse device 508 includes a fourth electrode 440. Third electrode 438 and fourth electrode 440 are formed within a second layer over, respectively, metal oxide layer 518 and metal oxide layer 514. Third electrode 438 and fourth electrode 440 can be formed using suitable deposition techniques and suitable materials such as TiW. Third electrode 438 is formed to be in vertical alignment with first electrode 412 and provides a conductive contact to metal oxide layer 518. Fourth electrode 440 is formed to be in vertical alignment with second electrode 414 and provides a conductive contact to metal oxide layer 514. Second conductor 442 is patterned and formed over and in conductive contact with third electrode 438 and second conductor 444 is patterned and formed over and in conductive contact with fourth electrode 440. The spacing 448 as illustrated has been defined in FIG. 4C.

Figure 6:
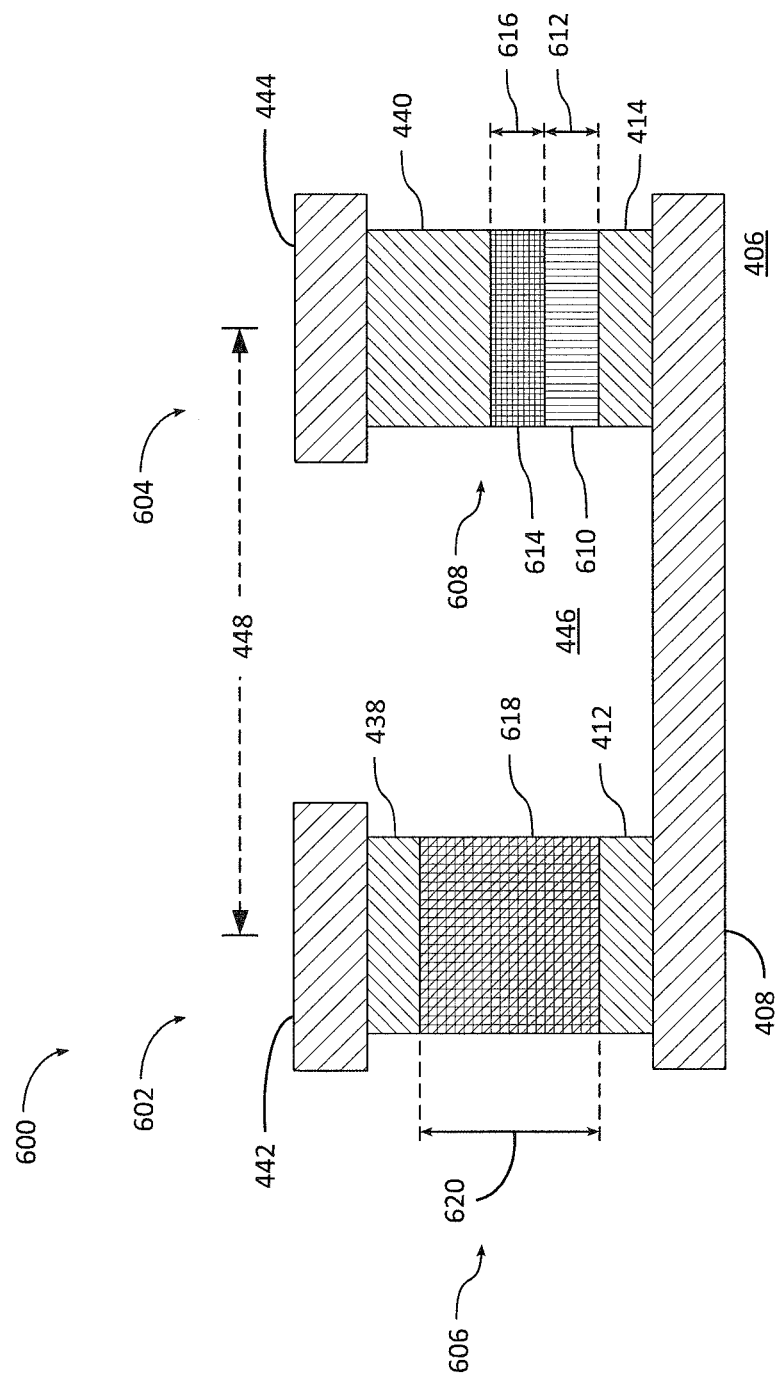
FIG. 6 illustrates a cross-sectional view of an embodiment of a resistive-switching memory cell and an antifuse cell.

FIG. 6 illustrates a cross-sectional view of an embodiment at 600 of a resistive-switching memory cell 602 and an antifuse cell 604. The process for forming resistive-switching memory cell 602 and antifuse cell 604 begins after the process sequence illustrated in FIG. 4A is complete. Resistive-switching memory cell 602 includes a resistive-switching memory device 606 and antifuse cell 604 includes an antifuse device 608. Referring also to FIGS. 4A-4C, a metal oxide layer 618 is formed over and is in contact with first electrode 412 and dielectric layer 610 is formed over and is in contact with second electrode 414. Metal oxide layer 618 has a first thickness 620 and dielectric layer 610 has a thickness indicated at 612. A second dielectric layer 614 is formed over first dielectric layer 610 and has a thickness indicated at 616. Dielectric layer 610 and dielectric layer 614 have a combined thickness which is equal to the combination of thickness 612 and thickness 616, which is equal to or less than a second thickness 424 as defined in FIG. 4C, and which is less than the first thickness 620. Resistive-switching memory device 602 has a forming voltage that corresponds to the first thickness 620 and metal oxide layer 618 has a first dielectric constant. The combination of dielectric layer 610 and dielectric layer 614 have a dielectric breakdown voltage that is less than the forming voltage for resistive-switching memory device 606. Because dielectric layer 610 and dielectric layer 614 have a combined thickness which is equal to or less than the second thickness 424 as defined in FIG. 4C, dielectric layer 610 and dielectric layer 614 will each have an electric field breakdown strength that is equal to or less than the dielectric breakdown voltage for the combination of dielectric layer 610 and dielectric layer 614 divided by the second thickness 424. In one embodiment, dielectric layer 610 and dielectric layer 614 each have a dielectric constant that is equal to or greater than the first dielectric constant for metal oxide layer 618. In other embodiments, the combination of dielectric layer 610 and dielectric layer 614 can include additional dielectric layers.

In the illustrated embodiment, metal oxide layer 618 and dielectric layers 610 and 614 are shown after being patterned and etched. Metal oxide layer 618 can be formed using suitable materials which include NiO, $HfO_2$, $Nb_2O_5$, TiO, $CrO_2$, $VO_2$, $Al_2O_3$, MgO and any combination or derivative of these materials. Dielectric layer 610 and dielectric layer 614 can be formed using suitable materials which are the same material or are different materials than used by metal oxide layer 618. These materials include NiO, $HfO_2$, $Nb_2O_5$, TiO, $CrO_2$, $VO_2$, $Al_2O_3$, MgO and any combination or derivative of these materials. These materials also include $SiO_2$, $Si_3N_4$, SiC and SiON, and any combination or derivative of these materials.

In the illustrated embodiment, resistive-switching memory device 606 includes a third electrode 438 and antifuse device 608 includes a fourth electrode 440. Third electrode 438 and fourth electrode 440 are formed within a second layer over, respectively, metal oxide layer 618 and dielectric layer 614. Third electrode 438 and fourth electrode 440 can be formed using suitable deposition techniques and suitable materials such as TiW. Third electrode 438 is formed to be in vertical alignment with first electrode 412 and provides a conductive contact to metal oxide layer 618. Fourth electrode 440 is formed to be in vertical alignment with second electrode 414 and provides a conductive contact to dielectric layer 616. Second conductor 442 is patterned and formed over and in conductive contact with third electrode 438 and second conductor 444 is patterned and formed over and in conductive contact with fourth electrode 440. The spacing 448 as illustrated has been defined in FIG. 4C.

Figure 7:
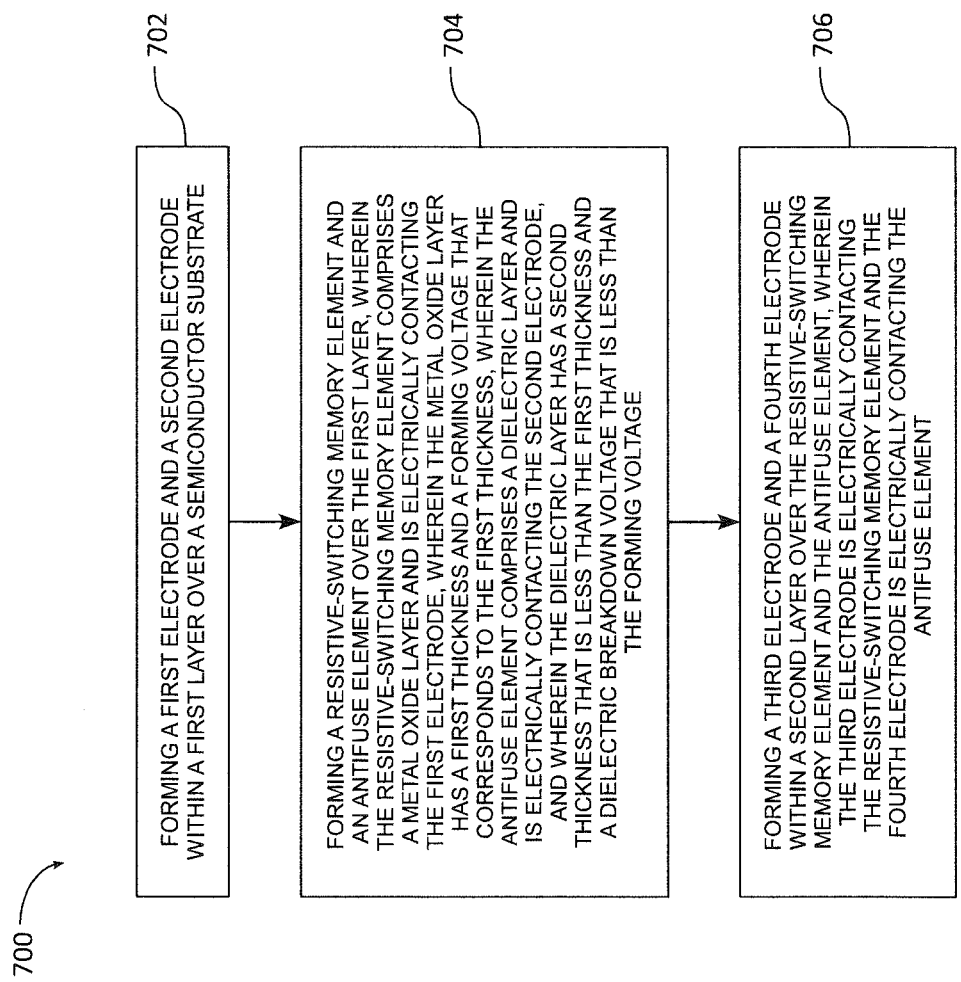
FIG. 7 illustrates a flowchart of an embodiment of method for forming a memory.

FIG. 7 illustrates a flowchart of an embodiment of method for forming a memory. The method is illustrated at 700. At 702, a first electrode 412 and a second electrode 414 are formed within a first layer over a semiconductor substrate 406. At 704, a resistive-switching memory element 426 and an antifuse element 422 are formed over the first layer. The resistive-switching memory element 426 comprises a metal oxide layer 426 and is electrically contacting the first electrode 412. The metal oxide layer 426 has a first thickness 450 and a forming voltage that corresponds to the first thickness 450. The antifuse element 422 comprises a dielectric layer 422 and is electrically contacting the second electrode 414. The dielectric layer 422 has a second thickness 424 that is less than the first thickness 450 and a dielectric breakdown voltage that is less than the forming voltage. At 706, a third electrode 438 and a fourth electrode 440 are formed within a second layer over the resistive-switching memory element 426 and the antifuse element 422. The third electrode 438 is electrically contacting the resistive-switching memory element 426 and the fourth electrode 440 is electrically contacting the antifuse element 422.

Figure 8:
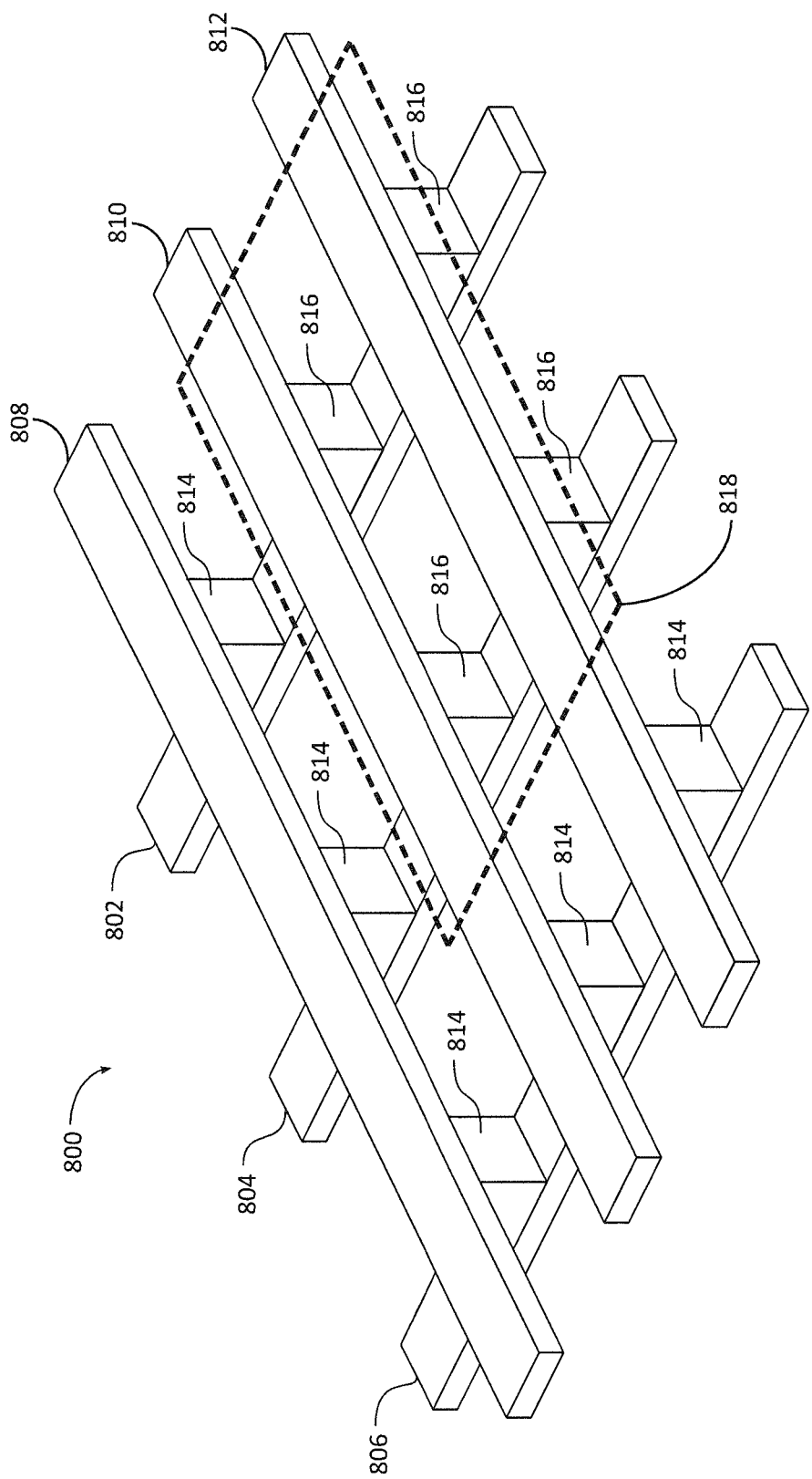
FIG. 8 illustrates a perspective view of an embodiment of a portion of the memory array illustrated in FIG. 1.

FIG. 8 illustrates a perspective view of an embodiment of a portion of the memory array 100 illustrated in FIG. 1. The memory array is illustrated at 800 and includes row lines 802, 804 and 806, and includes column lines 808, 810 and 812. Resistive-switching memory cells 814 correspond to cells 102 that are located outside of area 106 within memory array 100, and antifuse cells 816 correspond to cells 104 that are located within area 106 in within memory array 100. In FIG. 8, antifuse cells 816 are located within area 818 wherein area 818 corresponds to area 106 in FIG. 1.

The embodiments illustrated in FIGS. 4A-4C, FIG. 5 and FIG. 6 are cross-sectional views, respectively, of resistive-switching memory cell 402 and antifuse cell 404, resistive-switching memory cell 502 and antifuse cell 504, and resistive-switching memory cell 602 and antifuse cell 604. The embodiment illustrated at 800 in FIG. 8 is a perspective view of the embodiments illustrated at 400, 500 and 600.

In one embodiment, for illustration purposes, resistive-switching memory cells 402, 502 and 602 correspond to a cell 814 located at the intersection of row line 804 and column line 808, and antifuse cells 404, 504 and 604 correspond to a cell 816 located at the intersection of row line 804 and column line 810.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a memory, comprising:
   forming a first electrode and a second electrode within a first layer over a semiconductor substrate;
   forming a resistive-switching memory element and an antifuse element over the first layer, wherein the resistive-switching memory element comprises a metal oxide layer and is electrically contacting the first electrode, wherein the metal oxide layer has a first thickness and a forming voltage that corresponds to the first thickness, wherein the antifuse element comprises a dielectric layer and is electrically contacting the second electrode, and wherein the dielectric layer has a second thickness that is less than the first thickness and a dielectric breakdown voltage that is less than the forming voltage; and
   forming a third electrode and a fourth electrode within a second layer over the resistive-switching memory element and the antifuse element, wherein the third electrode is electrically contacting the resistive-switching memory element and the fourth electrode is electrically contacting the antifuse element.

2. The method of claim 1, wherein forming the resistive-switching memory element and the antifuse element over the first layer comprises forming the dielectric layer from two or more dielectric layers that each have an electric field breakdown strength that is equal to or less than the dielectric breakdown voltage divided by the second thickness, and wherein the two or more dielectric layers have a combined thickness that is equal to or less than the second thickness.

3. The method of claim 1, wherein forming the resistive-switching memory element and the antifuse element over the first layer comprises:
   forming a first metal oxide layer having the second thickness over the first electrode and the second electrode; and
   forming a second metal oxide layer over the first electrode, wherein the first metal oxide layer and the second metal oxide layer have a combined thickness over the first electrode that is equal to the first thickness.

4. The method of claim 1, wherein the metal oxide layer comprises a material selected from a group of materials consisting of $NiO$, $HfO_2$, $Nb_2O_5$, $TiO$, $CrO_2$, $VO_2$, $Al_2O_3$, $MgO$ and any combination or derivative of these materials.

5. The method of claim 1, wherein the dielectric layer comprises a material selected from a group of materials consisting of $SiO_2$, $Si_3N_4$, $SiC$, $SiON$ and any combination or derivative of these materials.

6. The method of claim 1, wherein forming the resistive-switching memory element and the antifuse element over the first layer comprises forming the metal oxide layer and the dielectric layer from a same metal oxide material.

7. The method of claim 1, wherein forming the resistive-switching memory element and the antifuse element over the first layer comprises forming the metal oxide layer and the dielectric layer with a same cross-sectional area.

8. The method of claim 1, wherein the metal oxide layer has a first dielectric constant, and wherein forming the resistive-switching memory element and the antifuse element over the first layer comprises forming the dielectric layer from two or more dielectric layers that each have a dielectric constant that is equal to or greater than the first dielectric constant, and wherein the two or more dielectric layers have a combined thickness that is equal to or less than the second thickness.

9. The method of claim 1, wherein the second thickness is equal to or greater than 2 nm.

10. A method of forming a memory array, comprising:
forming a first array of first conductors;
forming a second array of second conductors;
forming a plurality of resistive-switching memory cells, wherein each of the plurality of resistive switching memory cells comprises a resistive-switching memory device and is coupled between one of the first conductors and one of the second conductors, wherein the resistive-switching memory device comprises a metal oxide layer that has a first thickness and forming voltage that corresponds to the first thickness; and
forming a plurality of antifuse cells, wherein each one of the plurality of antifuse cells comprises an antifuse device and is coupled between one of the first conductors and one of the second conductors, wherein the antifuse device comprises a dielectric layer that has a second thickness that is less than the first thickness and a dielectric breakdown voltage that is less than the forming voltage,
wherein the metal oxide layer and the dielectric layer are formed within a same layer within the memory array, and wherein the plurality of resistive-switching memory cells and the plurality of antifuse cells each have a same area within the memory array that is defined by a first conductor pitch and a second conductor pitch.

11. The method of claim 10, wherein forming the plurality of resistive-switching memory cells and forming the plurality of antifuse cells comprises forming the metal oxide layer and the dielectric layer from a same metal oxide material.

12. The method of claim 10, wherein forming the plurality of resistive-switching memory cells and forming the plurality of antifuse cells comprises forming the metal oxide layer and the dielectric area with a same cross-sectional area.

13. The method of claim 10, wherein forming a plurality of antifuse cells comprises forming the dielectric layer from two or more dielectric layers that each have an electric field breakdown strength that is equal to or less than the dielectric breakdown voltage divided by the second thickness, and wherein the two or more dielectric layers have a combined thickness that is equal to or less than the second thickness.

14. The method of claim 10, wherein the metal oxide layer has a first dielectric constant, and wherein forming a plurality of antifuse cells comprises forming the dielectric layer from two or more dielectric layers that each have a dielectric constant that is equal to or greater than the first dielectric constant, and wherein the two or more dielectric layers have a combined thickness that is equal to or less than the second thickness.

15. The method of claim 10, wherein the metal oxide layer comprises a material selected from a group of materials consisting of NiO, $HfO_2$, $Nb_2O_5$, TiO, $CrO_2$, $VO_2$, $Al_2O_3$, MgO and any combination or derivative of these materials.

16. The method of claim 10, wherein the dielectric layer comprises a material selected from a group of materials consisting of $SiO_2$, $Si_3N_4$, SiC, SiON and any combination or derivative of these materials.

17. The method of claim 9, wherein the second thickness is equal to or greater than 2 nm.

* * * * *